(12) United States Patent
Song et al.

(10) Patent No.: US 6,490,702 B1
(45) Date of Patent: Dec. 3, 2002

(54) SCAN STRUCTURE FOR IMPROVING TRANSITION FAULT COVERAGE AND SCAN DIAGNOSTICS

(75) Inventors: Peilin Song, Wappingers Falls, NY (US); Richard F. Rizzolo, Red Hook, NY (US); Franco Motika, Hopewell Junction, NY (US); Ulrich W. Baur, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/473,810

(22) Filed: Dec. 28, 1999

(51) Int. Cl.⁷ .............................................. G01R 31/28
(52) U.S. Cl. ..................................................... 714/726
(58) Field of Search ................................. 714/726–727

(56) References Cited

U.S. PATENT DOCUMENTS

| | | | |
|---|---|---|---|
| 4,687,988 A | 8/1987 | Eichelberger et al. | 324/73.1 |
| 4,688,223 A | 8/1987 | Motika et al. | 714/728 |
| 4,801,870 A | 1/1989 | Eichelberger et al. | 714/736 |
| 5,488,318 A * | 1/1996 | Vajapey et al. | 326/46 |
| 5,640,402 A | 6/1997 | Motika et al. | 714/731 |
| 5,807,763 A | 9/1998 | Motika et al. | 438/18 |
| 6,185,710 B1 * | 2/2001 | Barnhart | 714/727 |

* cited by examiner

Primary Examiner—Albert Decady
Assistant Examiner—Shelly A Chase
(74) Attorney, Agent, or Firm—Lynn L. Augspurger

(57) ABSTRACT

A scan chain latch circuit is provided. The scan chain latch circuit includes a first shift register latch and a second shift register latch. The scan chain latch circuit also includes a multiplexor connected between the first and second shift register latches, the multiplexor has a select line for controlling the function of the multiplexor. The multiplexor is configured for implementing an inverting mode such that a logic value may be passed via the multiplexor from the first shift register latch to the second shift register latch in one of a non-inverted state and an inverted state based upon the state of the select line.

11 Claims, 16 Drawing Sheets

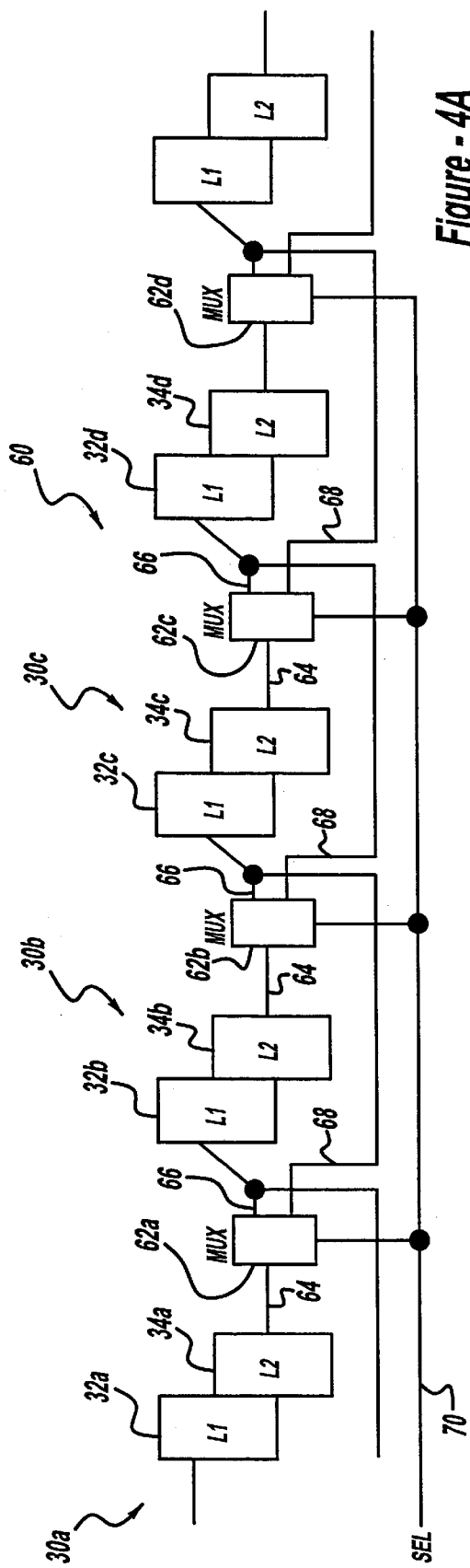
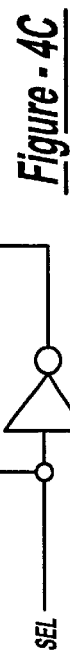
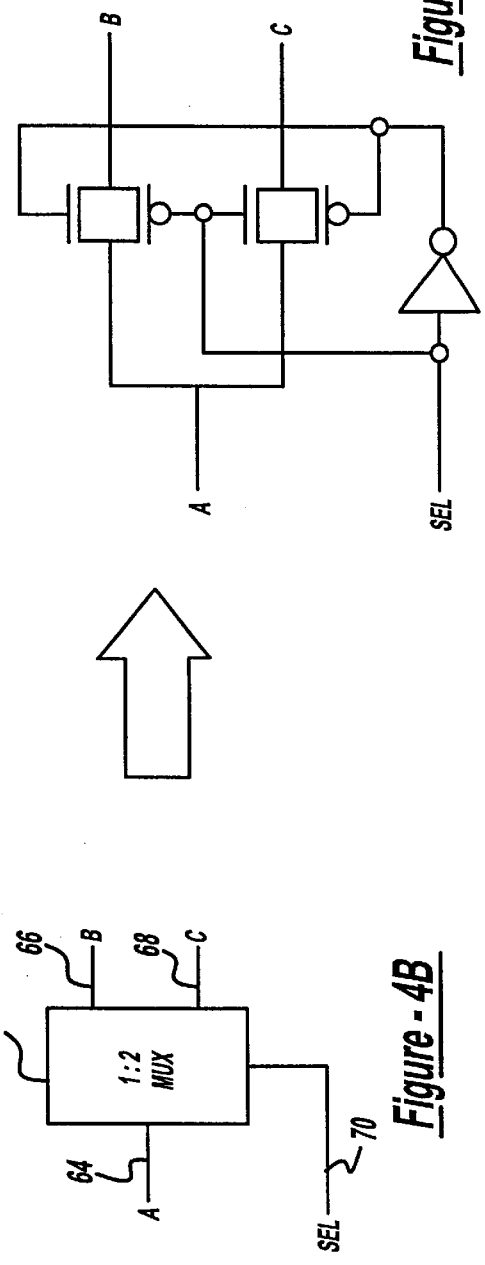

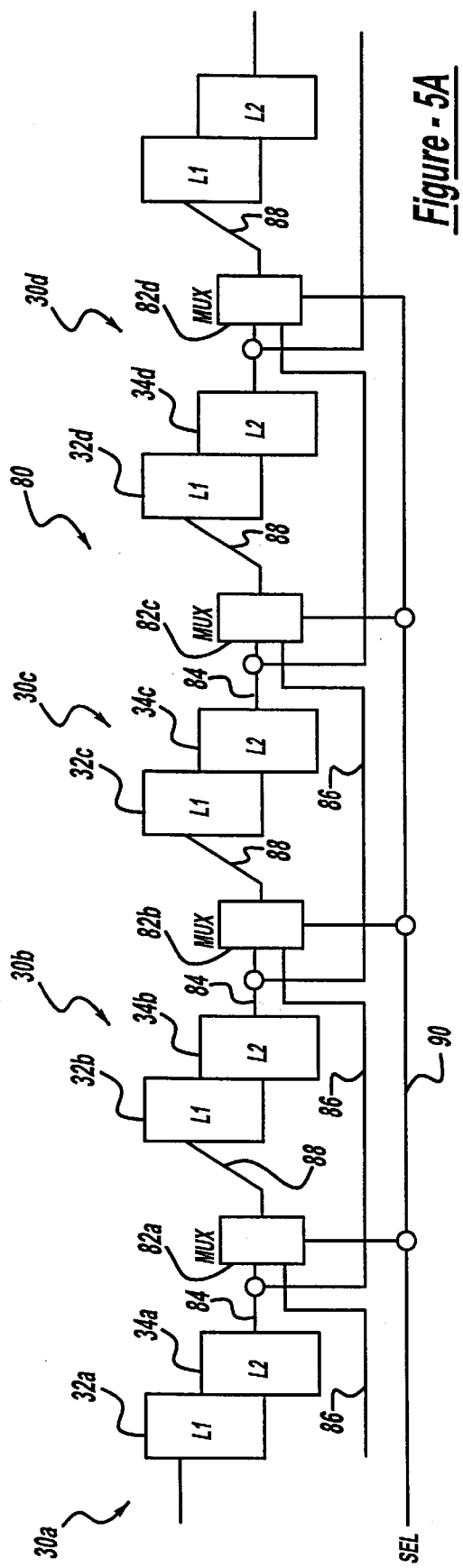
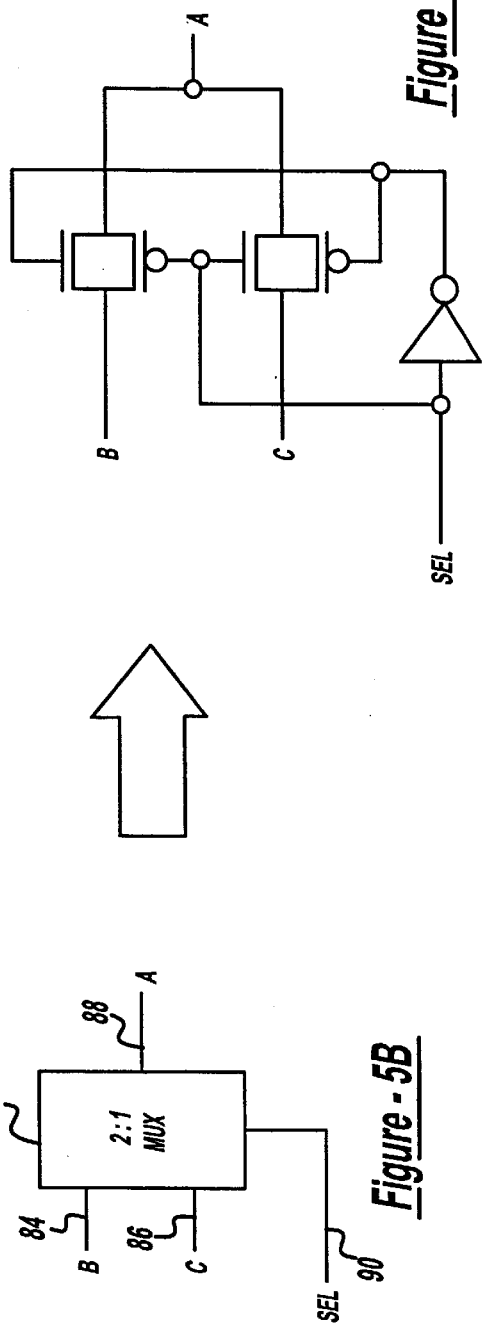
Figure - 5A
Figure - 5B
Figure - 5C

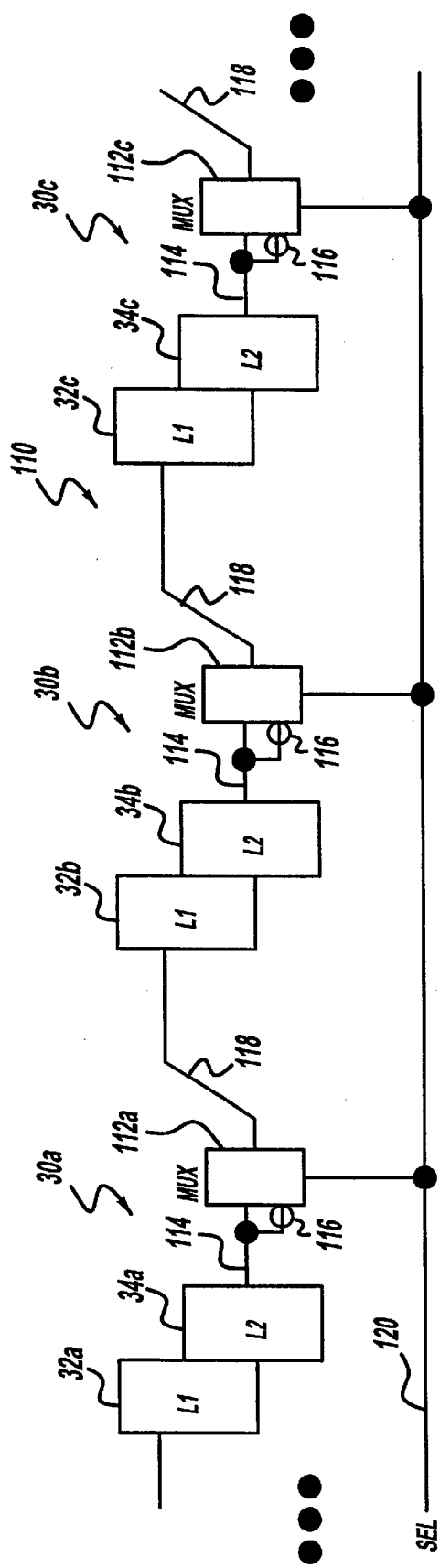
*Figure - 9A*
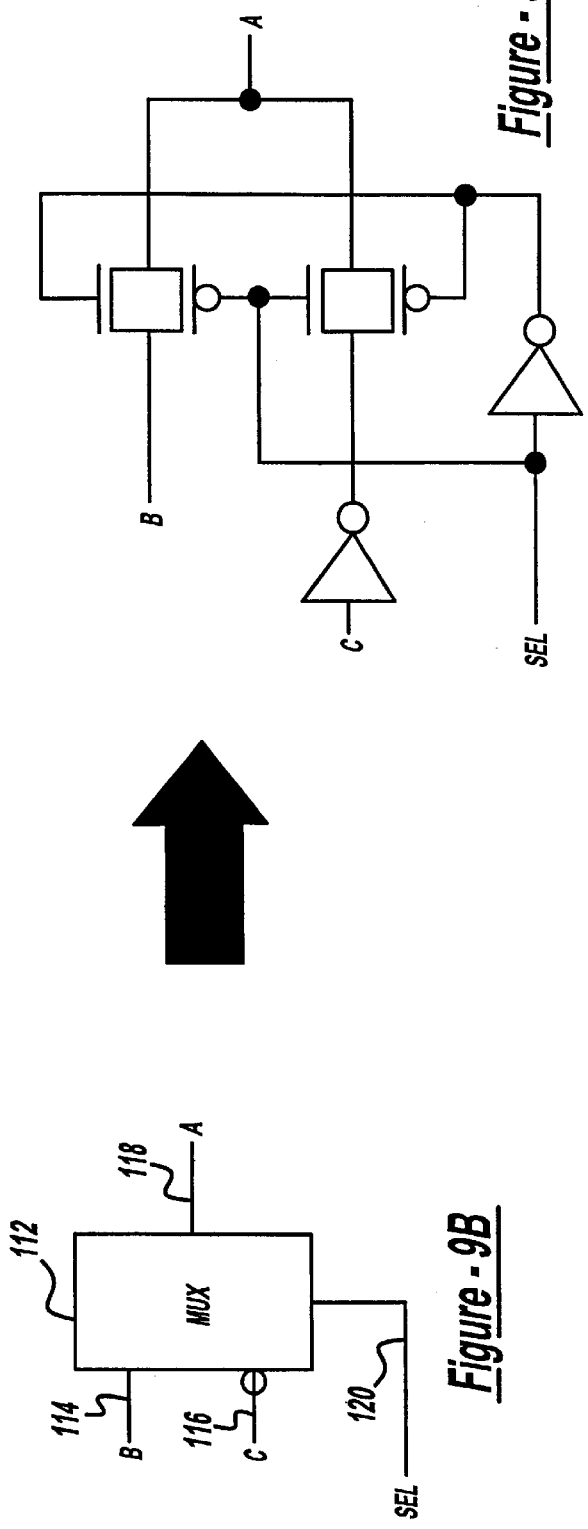
*Figure - 9C*
*Figure - 9B*

*Figure - 13*

SCAN STRUCTURE FOR IMPROVING TRANSITION FAULT COVERAGE AND SCAN DIAGNOSTICS

BACKGROUND OF THE INVENTION

1. Field of the Invention

The present invention relates generally to the testing and diagnosing of integrated circuits. More particularly, the present invention is directed to testing and diagnosing latch based scan chain defects and localizing these defects to a particular shift register latch. The present invention also provides a method and apparatus for enhancing test pattern generation for detecting delay defects.

2. Technical Background

The level-sensitive scan design (LSSD) and generalized scan design (GSD) test techniques (or simply scan design test techniques) enable testing at all levels of very large scale integrated (VLSI) circuit packaging. The circuit implemented on a chip using these techniques typically comprises several combinatorial logic blocks, each of which is associated with a storage cell consisting of a latch called a shift register latch (SRL). A single long shift register (SR), termed an LSSD chain, is formed by chaining a number of such cells or SRLs together. Each SRL, which is actually a pair of bistable latches designated L1 and L2, forms a single stage of the shift register.

The L1 latch can be set from two sources by two different clock signals, A and C, applied to clock inputs A and C, with the latter input receiving system clock signals. Latch L1 also has a data input (DI) and a test input called scan data in (SDI). Test patterns consisting of binary bit vectors are applied to the SDI pin of the chip. Latch L2 has a data input connected to one of the outputs of the associated L1 latch and an input that receives B clock signals causing the output data from L1 to be transferred into L2.

The long shift register (SR) referred to above is formed by connecting the output of the L2 latch in the first SRL (forming the first stage of the shift register) to the SDI input of the L1 latch in the next SRL, and so on, down to the last SRL. The test input SDI of the L1 latch in the first SRL is connected to the SDI pin of the chip, and the output of the L2 latch in the last SRL is connected to an output pin, designated the scan data out (SDO), of the chip. The A, B and C clocks of the SRL are connected to the chip pins so designated. Bits are transferred through the SRL in two steps. A bit applied to the test input SDI of latch L1 is loaded therein by the A clock pulse, and the same bit is obtained at the output of the L2 latch at the occurrence of the B clock pulse. A number of pairs of A and B clock pulses equivalent to the number of SRLs is required in order for a signal applied to the SDI input of a functional element to be transferred to the SDO output thereof. In this mode of operation, clock C is not pulsed.

To test a functional element, one portion being a scan path, a static test called a "flush" test is first performed. To this end, an active potential, for example a high logic level, is applied to the A and B clock inputs (A=B=1) while the C clock input receives a low logic level (C=0). A square pulse is applied to the SDI input of the chain to be tested and is retrieved at the SDO output after a predetermined time interval has elapsed. A typical SR chain may consist of numerous inversion steps. As a result, the data pulse applied to input SDI is obtained at output SDO of the chain after a time interval equal to the accumulated response times of all the SRLs in the chain has elapsed. In addition to providing useful information on the propagation times, the flush test determines whether the LSSD chain is functioning properly.

A dynamic test called a "scan" test is next performed. In this test, the C clock is maintained at a low logic level while pulsing the A and B clocks. The LSSD chain then acts as a shift register. This test serves to establish that the chain is not operating properly if the data pulse applied to the SDI input fails to be transferred to the SDO output when an appropriate number of clock pulses are applied to the A and B clock inputs.

A functional test is then performed in the scan mode. In this test, a test pattern (a series of binary data) is applied to the SDI input and the A and B clocks are pulsed to transfer the test pattern into the SRLs. All the latches in the functional element having thus been initialized, logic data are present on the parallel output pins of the chip. By applying stimuli to the parallel output pins of the chip and pulsing the C clock, a binary vector reflecting some particular state of the combinatorial logic is loaded in the LSSD chain. The output pins and SRL states are then observed to determine if the combinatorial logic is functioning properly as compared to the expected states determined by a computer simulation model.

The basis for logic built-in self-test (LBIST) and array built-in self-test (ABIST) methodology is to generate product test vectors in order to detect potential faults in the product while the output responses are measured at primary outputs (POs) or captured into a multiple input shift register (MISR). In the diagnostic mode, the strategy is to scan out and observe each response that will be captured into the MISR signature, rather than one scan out of the MISR signature at the end-of-test.

A manufacturing defect in a semiconductor chip may cause a stuck fault, where an input or output of a circuit is stuck at a single logic value. An object of the present invention is to increase diagnosability of stuck faults located in the scan chain. In the introduction of a new semiconductor process, scan chain diagnostics become a very useful vehicle for yield learning. However, diagnosing scan chain stuck faults with present methods is neither simple nor guaranteed. Rapid diagnosis to a location for Physical Failure Analysis (PFA) is needed to understand and correct the process problem. It is therefore desirable to modify the scan chain and provide a fast way of locating scan chain stuck faults which is also suitable for automation.

Another type of defect may cause the switching time of a circuit to become abnormally slow. This is known as a delay or transition fault. As, semiconductor technology has become more miniaturized, the incidence of transition fails caused by delay defects has increased dramatically. There are a number of mechanisms involving wire opens or partial opens that can cause excessive path delay. In order to maintain acceptable product quality levels of large multi-chip modules, high delay test coverage is usually required. Delay test coverage is generally lower than stuck fault coverage because delay tests must use two test patterns in order to define a transition. One factor limiting delay test coverage is that the latch settings required to cause a transition often conflict with the latch settings to propagate that transition. As an example, to test a 2-way AND circuit for slow-to-rise faults on an input, that input must have a logic 0 to logic 1 transition while the other input is held at 1. If both inputs to the AND circuit are driven by SRLs adjacent in the scan chain that pattern is not possible. The 0 to 1 transition on one input will cause the final state of the other input to be 0, thus blocking the transition from propagating to an observable location. This is the well known latch adjacency or correlated latch problem. Other techniques using multiple time image test generation have been used to solve this problem. Those algorithms, however, are significantly slower and the subsequent test patterns are less diagnosable. Accordingly, it is desirable to provide an apparatus and technique for solving the problems associated with circuit testing. It is further desirable to provide a solution for testing two input AND gates (as well as NAND, OR, and NOR gates) and significantly improve the testability of the multiple input functions using single time image algorithms.

SUMMARY OF THE INVENTION

According to the teachings of the present invention a 1:2/2:1 multiplexor (MUX) placed between every pair of SRLs. The one output/input from/to the MUX feeds directly to/from the scan port of adjacent SRL and the other output/input of the MUX is wired jump to/from the scan port of the next/previous SRL. In the preferred embodiment all MUXs are driven by a common control signal, although that is not a requirement. If a scan-in pattern with the MUX control set to logic 1 cannot be found to simultaneously generate and propagate a transition, there is a high probability a scan-in pattern exists with the MUX control set to logic 0 which can perform that transition fault test.

In addition, with this new scan structure stuck-at scan faults can be diagnosed. A stuck-at fault can be identified when the MUX control in one state and the failing location can be diagnosed when the MUX control is in the opposite logic state. The fault that blocks the scan chain will be propagated to the next latch and the adjacent latch will get new data. This new data will be scanned out as the evidence of the fault location.

In another alternate embodiment, the present invention uses a 2:1 multiplexor placed between every pair of SRLs. One input from the MUX is fed directly from the scan-out port of the previous SRL, and the other input from the MUX is the inversion of the first input signal. In the preferred embodiment all MUXs are driven by a common control or select signal SEL, although this is not a requirement. If a transition test requirement has a scan conflict for SEL=0, then setting SEL=1 in many cases resolves the scan conflict. With this MUX and inverter combination in place between every latch, delay fault testability is significantly increased. 100% of transition faults on two input NAND, AND, OR, and NOR are testable even if both inputs are fed by adjacent latches. Similarly, transition fault testability is significantly increased for three input and four input circuits fed by adjacent latches.

As part of the present invention a scan chain latch circuit is disclosed. The scan chain latch circuit includes a first shift register latch and a second shift register latch. The scan chain latch circuit also includes a multiplexor connected between the first and second shift register latches, the multiplexor has a select line for controlling the function of the multiplexor. The multiplexor is configured for implementing an inverting mode such that a logic value may be passed via the multiplexor from the first shift register latch to the second shift register latch in one of a non-inverted state and an inverted state based upon the state of the select line.

Another benefit is that the scan structure of the present invention can be used to diagnose single stuck-at faults in the scan chain. To do this, the scan chain is fully loaded in a state opposite the stuck value with SEL=0. The inversion control signal SEL is then set to 0 enabling the inverted scan mode. The chain is then scanned-out. Because the inverted scan mode is set, an alternate 101010 . . . pattern is expected on the scan out pin. When that pattern is broken, i.e., the same value appears consecutively, the fault is detected. The location of the stuck fault is determined by the number of scan clocks that were applied when the consecutive values appeared.

BRIEF DESCRIPTION OF THE DRAWINGS

The various advantages of the present invention will become apparent to one skilled in the art by reading the following specification and appended claims, and by referencing the following drawings in which:

FIG. 4A is a schematic diagram of the scan chain circuit in accordance with a preferred embodiment of the present invention;

FIG. 4B is an isolated block diagram of the multiplexor circuit connected in the scan chain circuit of FIG. 4A;

FIG. 4C is a schematic diagram of the multiplexor circuit (MUX) connected between the latches of the scan chain circuit of FIG. 4A;

FIG. 5A is a schematic diagram of the scan chain circuit in accordance with an alternate preferred embodiment of the present invention;

FIG. 5B is an isolated block diagram of the multiplexor circuit connected in the scan chain circuit of FIG. 5A;

FIG. 5C is a schematic diagram of the multiplexor circuit (MUX) connected between the latches of the scan chain circuit of FIG. 5A;

FIG. 9A is a schematic diagram of the scan chain circuit also in accordance with an alternate preferred embodiment of the present invention;

FIG. 9B is an isolated block diagram of the multiplexor circuit connected in the scan chain circuit of FIG. 9A;

FIG. 9C is a schematic diagram of the multiplexor circuit (MUX) connected between the latches of the scan chain circuit of FIG. 9A;

FIG. 13 is a state diagram for a three input NAND gate;

DETAILED DESCRIPTION OF THE PREFERRED EMBODIMENTS

Figure 1:
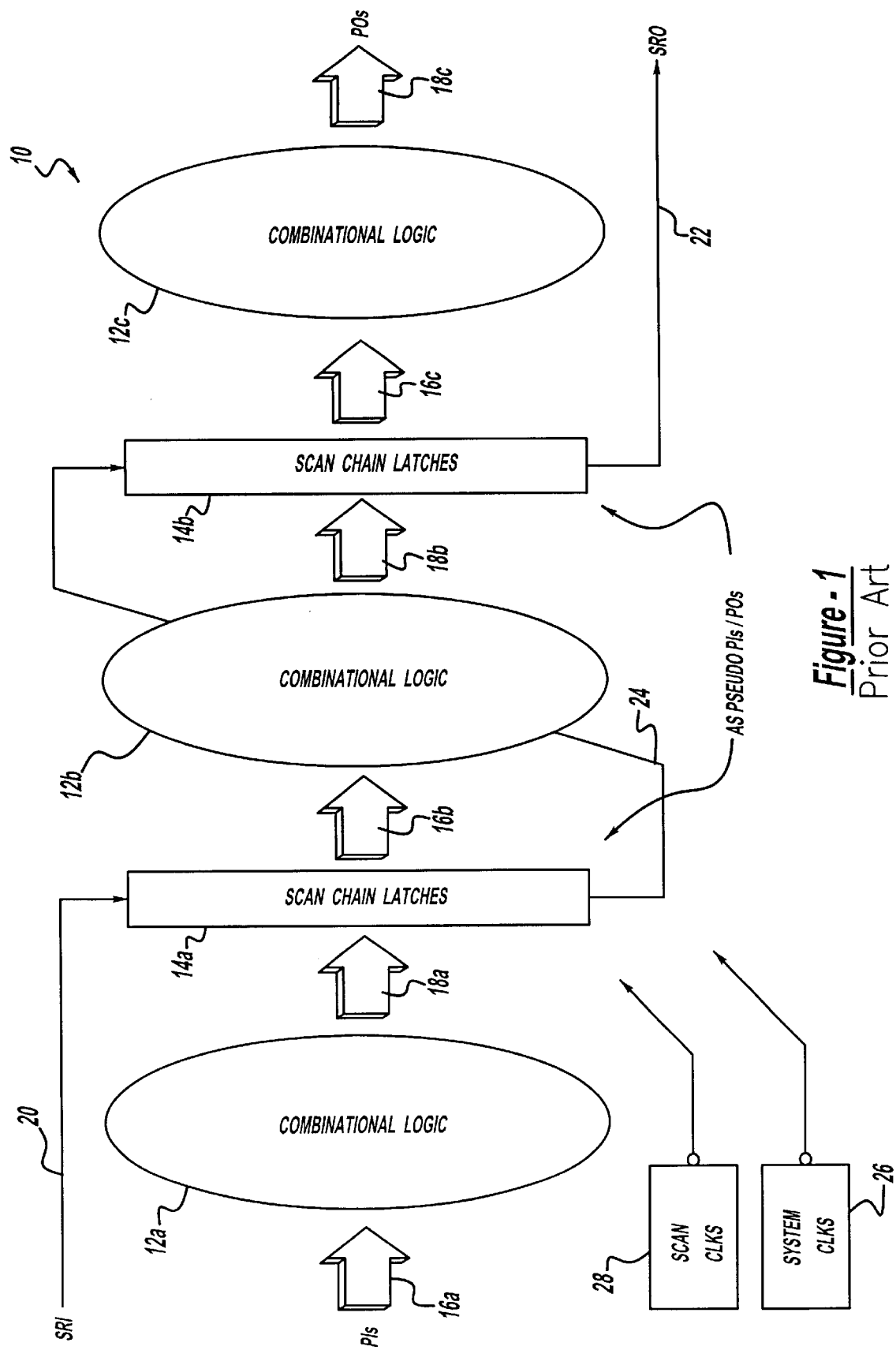
FIG. 1 is a block diagram showing a typical level sensitive scan design (LSSD) circuit architecture.

Reference will now be made in detail to the present preferred embodiments of the invention, examples of which are shown in the accompanying drawings. Whenever possible, the same reference numerals will be used throughout the drawings to refer to the same or like parts.

Referring now to FIG. 1, a level sensitive scan design (LSSD) circuit architecture 10 is shown in block diagram form. The LSSD configuration 10 includes combinational logic blocks 12a, 12b, 12c. The combinational logic blocks 12a, 12b, 12c represent combinational logic which executes various predetermined logic functions. The combinational logic blocks are interconnected by a scan chain latch circuit 14a, which interconnects combinational logic blocks 12a and 12b, and scan chain latch circuit 14b which interconnects combinational logic blocks 12b and 12c.

Data is input to the combinational logic blocks 12a, 12b, 12c in a parallel or broadside manner via respective primary input (PI) vectors 16a, 16b, 16c. Data is output from the combinational logic blocks 12a, 12b, 12c in a parallel fashion to the primary output (PO) vectors 18a, 18b, 18c, respectively. The PO vectors 18a, 18b function as PI vectors to respective scan chain latch circuits 14a, 14b.

The scan chain latch circuits 14a, 14b may also be loaded serially to enable testing of the scan chain latches 14a, 14b. In particular, shift register input (SRI) line 20 provides a serial input to scan chain latch 14a. Similarly, shift register output (SRO) line 22 provides an output from scan chain latch 14b. Scan chain latches 14a, 14b are interconnected by serial line 24. Serial line 24 functions as a SRO for scan chain latch 14a and as an SRI for scan chain latch 14b. One or a plurality of system clocks 26 output timing signals to control timing operations of the combinational logic blocks 12 and scan chain latches 14. One or a plurality of scan chain clocks 28 provide timing signals to scan chain latches 14.

Figure 2:
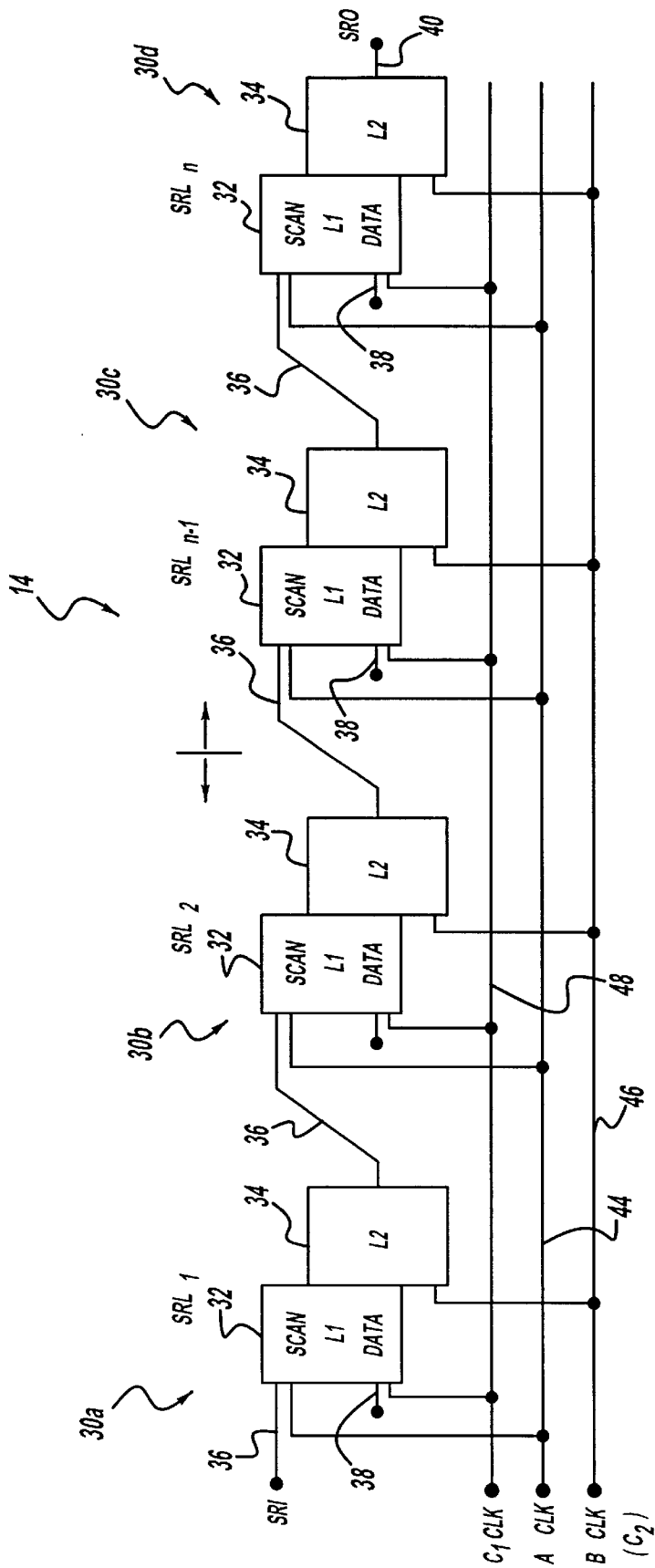
FIG. 2 is a schematic diagram showing a typical LSSD scan chain circuit configuration known within the prior art.

FIG. 2 shows an exemplary scan chain latch circuit 14. Scan chain latch 14 comprises a plurality of shift register latches (SRL) 30, also designated as $SRL_1$, $SRL_2$, . . . $SRL_{N-1}$, $SRL_N$. Thus, each scan chain latch 14 comprises a plurality of shift register latches 30a, 30b, 30c, 30d. The number of shift register latches 30 depends upon the width of PI vectors 16 and PO vectors 18. Each SRL 30 includes a master latch 32 and a slave latch 34. Serial data, such as described with respect to FIG. 1, is input to master latch 32 on SRI line 36. Each bit line of the primary input PI vector is input to a respective parallel data line 38. As will be described in greater detail, data is clocked into each SRL 30 by applying a clock pulse to master latch 32. Data is clocked out of each SRL 30 by applying a clock pulse to slave latch 34. Data is output from slave latch 34 to a succeeding master latch 32, or with respect to SRL 30d, SRO line 40. Each SRI line 36 and SRO line 40 may also function as a parallel output data line 42 to effect a parallel output from scan chain latch 14, as described in FIG. 1.

The operational timing of scan chain latch 14 is effected by system and scan clock signals as referred to in FIG. 1. In particular, serial loading of master latch 32 occurs upon generation of an A-clk pulse on A-clk line 44. The A-clk pulse on A-clk line 44 causes serial input applied to SRI line 36 to be input to each master latch 32. Application of a B-clk pulse on B-clk line 46 causes data to be output from SRL 30 via slave latch 34. The continuous, alternating application of A-clk and B-clk clock pulse signals on respective A-clk line 44 and B-clk line 46 sequentially propagates a data signal applied to SRI 36 of SRL 30a through scan chain latch 14. To effect a parallel load, a $C_1$-clk clock pulse is applied to C-clk line 48 to cause a parallel load of data via parallel data lines 38 to each master latch 32 of SRL 30. Application of a $C_2$-clk clock pulse to B-clk line 46 causes a parallel output of data from each slave latch 34 of SRL 30 to provide data on respective parallel output data lines 42. With reference to FIG. 1, $C_1$-clk and $C_2$-clk clock pulses correspond to system clocks 26, and A-clk and B-clk clock pulses correspond to scan clocks 28 of FIG. 1.

In typical level sensitive scan design (LSSD) circuit configurations, each scan chain latch 14 can be used as a pseudo-primary input and a pseudo-primary output of each combinational logic block 12 in addition to the PIs and POs for LSSD circuit 10. This enables the stimulation and observability of the device being tested or diagnosed. A problem is encountered when the scan chain does not function properly and access to the internal logic of the device is greatly reduced. This is often the case early in the technology or the product introduction cycle when yields are relatively low. In such situations, the rapid determination of the root cause is critical, but may be difficult to diagnose. For example, when there is a stuck-at fault on scan chain 14, for instance a stuck-at logic 1 fault, a serial input on input 20 of logic 1 will come out of the scan chain 14 on output 22 after a certain number of clock cycles, no matter if a serial input on input 20 of logic 0 or 1 is scanned in. From this result, it can be determined that there is a stuck-at 1 fault in the scan chain 14, but the exact SRL 30 with the faulty condition can not be located or even isolated. While several techniques have been developed in the past to diagnose this type of failure, these techniques have produced limited success. Scan based designs are fairly common, and the scan chains represent a significant portion of the surface area of an integrated circuit. Thus, a solution which speeds the identification of faulty scan chain latches on questionable integrated circuits provides timely yield improvements, thereby insuring successful production of the design. Preferably, a scan chain fault can be diagnosed within a manageable number of logic blocks in the minimum time. This expedites isolation of further investigation using conventional physical failure analysis tools.

Figure 3:
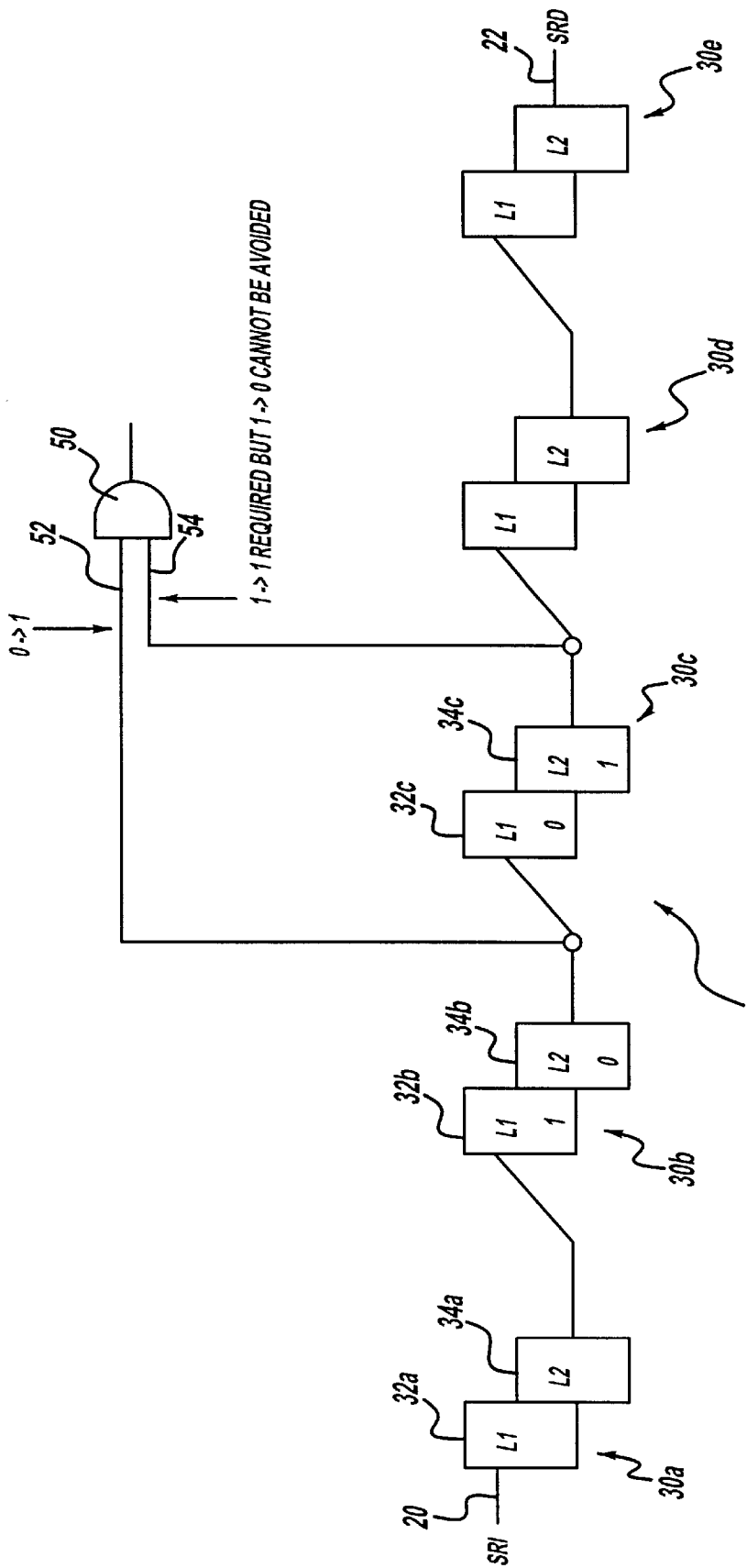
FIG. 3 is a schematic diagram demonstrating a latch adjacency problem associated with the scan chain circuit of FIG. 2.

Another advantage the present invention provides is a more effective test pattern generation for delay or transition faults. These transition faults may be in any logic path, not just the scan path. FIG. 3 shows a simplified scan chain latch 14 and demonstrates a known latch adjacency problem. The scan chain latch 14 also includes a plurality of shift register latches 30a–30e, where each shift register latch 30 includes a master latch 32 and a slave latch 34. The scan chain 14 includes a serial input 20 to SRL 30a and a serial output 22 from SRL 30*e*. FIG. 3 also shows an AND circuit or gate 50 having a first input 52 connected to the output of SRL 30*b*, and a second input 54 connected to the output of SRL 30*c*. A known problem with scan chain 14 is the inability to test certain logic state transitions at the inputs of the AND gate 50 when adjacent latches 30*b*, 30*c* feed both inputs 52, 54 of the AND circuit 50. For example, in order to test the slow-to-rise fault (0 to 1) on input 52 of AND gate 50, the input 54 requires a 1 to 1 logic transition. As shown by the logic 1 and 0 states of latches 32*b* and 34*b* respectively, and the 0 and 1 logic states of the latches 32*c* and 34*c*, the necessary 0 to 1 transition can be provided to first input 54. However, the necessary 1 to 1 logic transition cannot be provided to the second input 56 because slave latch 34*b* and master latch 32*c* are directly connected and have the same logic 0 value. Thus, because of the structure of scan chain 14 (adjacent latches feeding the same basic logic gate) the required test patterns can never be achieved. This latch adjacency problem can dramatically reduce the delay fault coverage, and further impact the delay fault shipped product quality level (SPQL).

Turning now to FIGS. 4A–4C a modified scan chain latch circuit 60 is shown in accordance with a preferred embodiment of the present invention. The scan chain latch circuit 60 also comprises a plurality of shift register latches 30*a*–30*e*. Each SRL 30 includes a master latch 32 and a slave latch 34. A unique feature of the scan chain latch 60 is that a 1:2 multiplexor (MUX) 62 is placed between each SRL 30. As shown in FIG. 4B, MUX 62 includes an a-input 64, a b-output 66 and a c-output 68. In operation, the logic signal present on the a-input 64 can be output to either the b-output 66 or c-output 68. The switching between output lines 66, 68 is controlled by a select line 70. When one output is selected, the other output is assumed to be in a high impedance state. Multiplexor 62 is a known electrical component, and a schematic diagram of its internal circuitry is shown in FIG. 4C.

Referring back to FIG. 4A, the a-input 64 of MUX 62*b* is connected to the output of the adjacent upstream slave latch 34*b*. The b-output 66 is connected to the input of the adjacent downstream master latch 32*c*. The c-output 68 of MUX 62*b* bypasses the adjacent downstream SRL 30*c*, bypasses the MUX 62*c* and connects to the input of the master latch 32*d*. As shown, the input to master latch 32*d* is also a common node of the b-output of the next downstream MUX 62*c*. However, when the c-output from the MUXs 62 are selected, the b-output will be in a high impedance state. Thus, the c-output 68 of each MUX 62 "jumps" the adjacent SRL 30, and connects to the SRL 30 two latch places down the chain. All of the MUXs 62 are connected in this fashion. As will be appreciated, this configuration creates a "jump" circuit which allows certain shift register latches 30 in the chain to be jumped-over depending on the state of the selection line 70. While it is preferred that all multiplexors 62 are driven by a common select signal 70, this is not a requirement. By utilizing the multiplexor and jump connection scheme of FIG. 4A, it is much more likely to find a pattern to cause a transition (1,0; 0,1; 1,1; 0,0) and propagate that transition, as long as the stuck-at fault at the same point is testable. If a scan-in pattern with the select line 70 set to logic 1 cannot be found to simultaneously generate and propagate the desired transition, there is a high probability a scan-in pattern exists with the select line 70 set to logic 0 which can propagate the transition for performing the test.

With the scan chain structure 60 of FIG. 4A, a stuck-at scan fault can be easily diagnosed. A stuck-at fault can be identified when the select line 70 is in one state, and the failing SRL 30 can be diagnosed when the select line 70 is in the second state. The fault that blocks the scan chain 60 will be propagated to the next SRL 30 and the adjacent SRL 30 will get new data. This new data will be eventually scanned out as the evidence of the fault location. An example of this diagnostic technique is clearly shown in FIG. 7B, and is described in greater detail below.

Turning now to FIGS. 5A–5C a modified scan chain latch circuit 80 is shown in accordance with an alternate preferred embodiment of the present invention. The scan chain circuit 80 also comprises a plurality of shift register latches 30*a*–30*e*. Each SRL 30 includes a master latch 32 and a slave latch 34. The distinguishing feature of the scan chain latch 80 is that a 2:1 multiplexor (MUX) 82 is placed between each SRL 30. As shown in FIG. 5B, MUX 82 includes an b-input 84, a c-input 86 and an a-output 88. In operation, the logic signal present on either the b-input 84 or the c-input 86 can be output to the a-output 88. The switching between a-output line 88 is controlled by a select line 90. When one input is selected, the other input is ignored. Multiplexor 82 is a known electrical component, and a schematic diagram of its internal circuitry is shown in FIG. 5C.

Referring back to FIG. 5A, the b-input 84 of MUX 82*b* is connected to the output of the upstream adjacent slave latch 34*b*, and is also "jump" connected to the c-input 86 of the next downstream MUX 82*c*. The a-output 88 of MUX 82*b* connects to the input on the next adjacent master latch 32*b*. As shown, the c-input 86 to MUX 82*c* is also a common node to the output of the slave latch 34*b* and the b-input of MUX 82*b*. However, when the c-inputs 86 on the MUXs 82 are selected, the b-inputs 84 will be ignored. All of the MUXs 82 are connected in this fashion. As will be appreciated, this configuration also creates a "jump" circuit (in the downstream direction) which allows certain shift register latches 30 to be jumped-over depending on the state of the selection line 90. While it is preferred that all multiplexors 82 are driven by a common select signal 90, this is not a requirement. By utilizing the multiplexor and jump connection scheme of FIG. 5A, it is much more likely to find a pattern to cause a transition (1,0; 0,1; 1,1; 0,0) and propagate that transition, as long as the stuck-at fault at the same point is testable. If a scan-in pattern with the select line 90 set to logic 1 cannot be found to simultaneously generate and propagate the desired transition, there is a high probability there will exist a scan-in pattern with the select line 90 set to logic 0 which can propagate the transition for performing the test.

With the scan chain structure 80 of FIG. 5A, a stuck-at scan fault can be easily diagnosed. A stuck-at fault can be identified when the select line 90 is in one state, and the failing SRL 30 can be diagnosed when the select line 90 is in the second state. The fault that blocks the scan chain 80 will be propagated to the next SRL 30 and the adjacent SRL 30 will get new data. This new data will be eventually scanned out as the evidence of the fault location. An example of this diagnostic technique is clearly shown in FIG. 7B, and is described in greater detail below.

Figure 6:
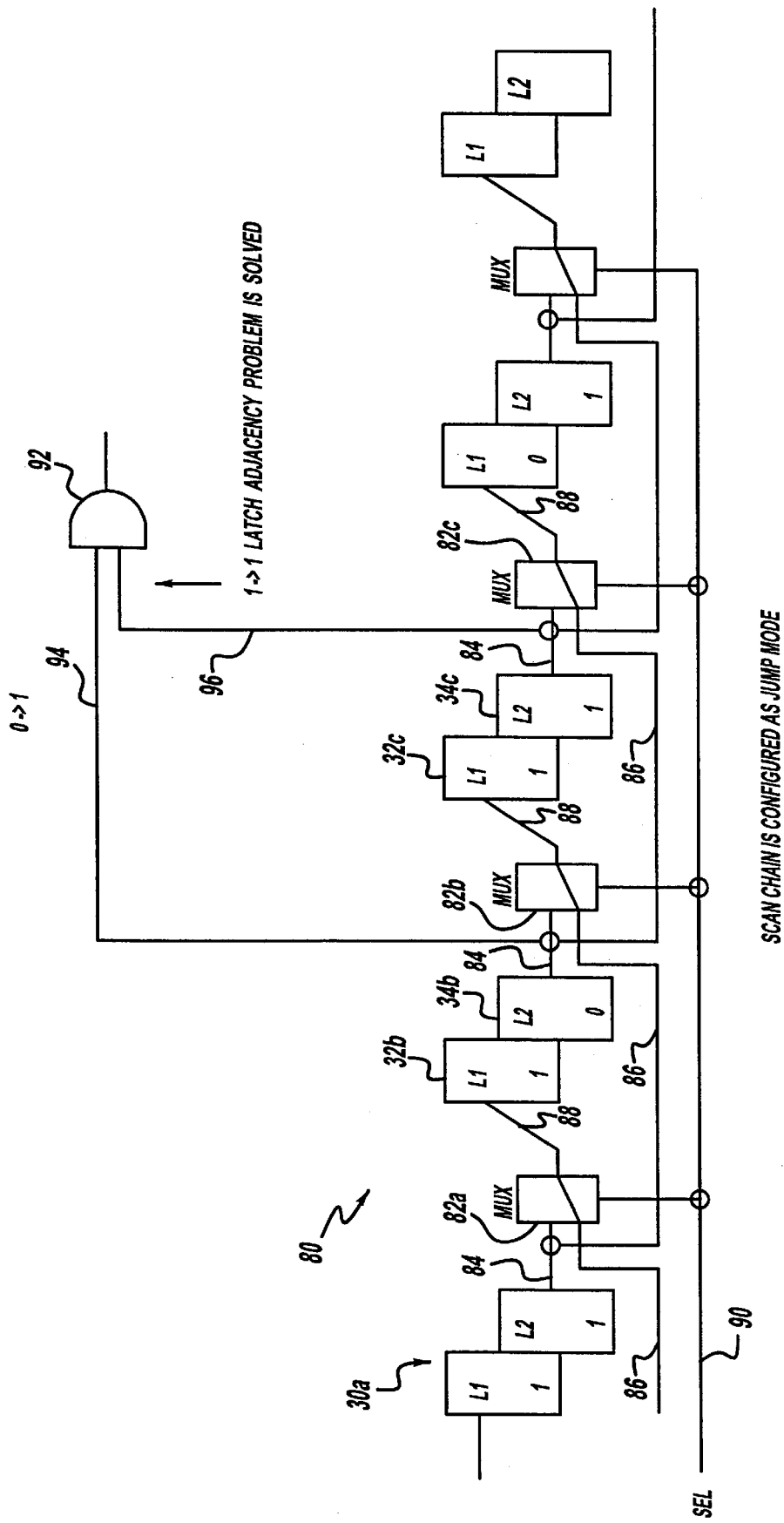
FIG. 6 is a schematic diagram demonstrating how the scan chain circuits of FIGS. 4A and 5A overcome the latch adjacency problem shown in FIG. 3.

FIG. 6 shows the scan chain circuit 80 of FIG. 5A and further demonstrates one technique for solving the latch adjacency problem of FIG. 3. The scan chain circuit 80 also includes an AND gate 92 having a first input 94 connected to the output of slave latch 34*b* and a second input 96 connected to the output of slave latch 34*c*. The scan chain circuit 80 is shown in "jump" mode where the c-input 86 of each MUX 82 passes through to the a-output 88. As shown by the logic 1 and 0 states of latches 32*b* and 34*b* respectively, and the 1 and 1 logic states of the latches 32c and 34c, a 0 to 1 transition can be provided to first input 94, and a 1 to 1 transition can be provided to the second input 96. This is because the logic 1 and 1 states of latches 32a and 32b "jump" SRL 30b and are scanned into SRL 30c. Accordingly, one skilled in the art will appreciate that either scan chain circuit 60 of FIG. 4A or scan chain circuit 80 if FIG. 5A can be used as a solution to the latch adjacency problem of FIG. 3.

Figures 7A, 7B:
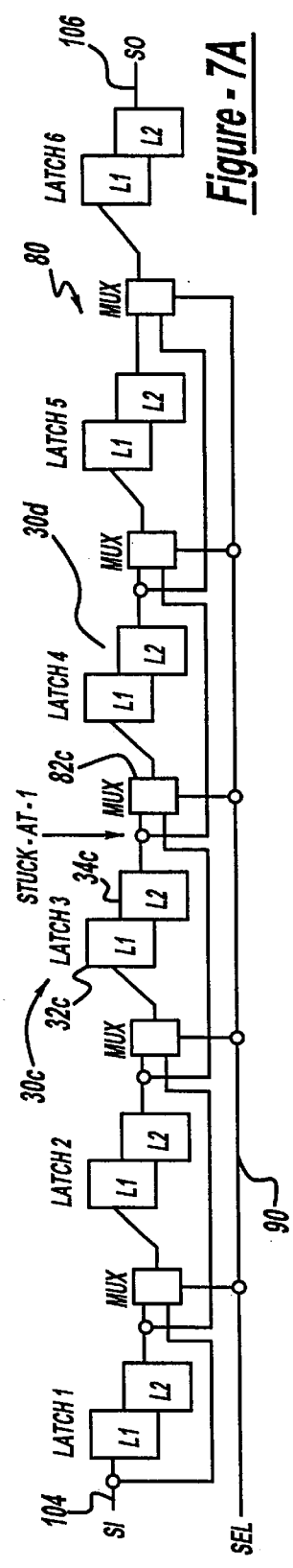
FIG. 7A is a schematic diagram of the scan chain circuit of the present invention demonstrating a stuck value fault at the output of the third shift register latch (SRL) in the scan chain.
FIG. 7B is a logic table showing the steps for diagnosing a faulty scan chain or SRL utilizing the select feature of the multiplexors.

FIG. 7A also shows the scan chain circuit 80 of FIG. 5A and also includes the 2:1 MUX 82 connected between each SRL 30. For exemplary purposes, FIG. 7A shows that the output of SRL 30c has a stuck-at 1 fault which is feeding into the b-input 84 of multiplexor 82c.

FIG. 7B shows a table used for diagnosing a fault associated with scan chain 80 of FIG. 7A. For the exemplary test, it is assumed that a series of logic 0 values are scanned into input 104. When the select line 90 is in its first or logic 0 state, the latches 30a–30f operate serially during consecutive clock cycles, and the b-input 82 of each MUX 82 is passed to the a-output 88. Thus, if scan chain circuit 80 is operating properly, the same series of logic 0 values should appear on output 106. As shown, seven clock cycles (0–6) are required to fully detect the fault at box 98 associated with the stuck-at 1 fault of SRL 30c. However, when select line 90 is placed into its second or logic 1 state, the multiplexors 82 create a jump mode, and the c-input 86 is passed to the a-output 88. As shown, the jump feature allows the detected fault to be diagnosed at box 100 in two additional clock cycles. This is because the stuck-at 1 fault on the output of latch 34c is bypassed by MUX 82c. Two clock cycles after a logic 0 appears on the c-input 86 of MUX 82c that same logic 0 appears on the SO pin 106 at block 100. Accordingly, once a fault is detected at box 98, the location of the fault can be specifically located and diagnosed at box 100 by placing the multiplexors 82 into the jump mode via select line 90.

Figure 8:
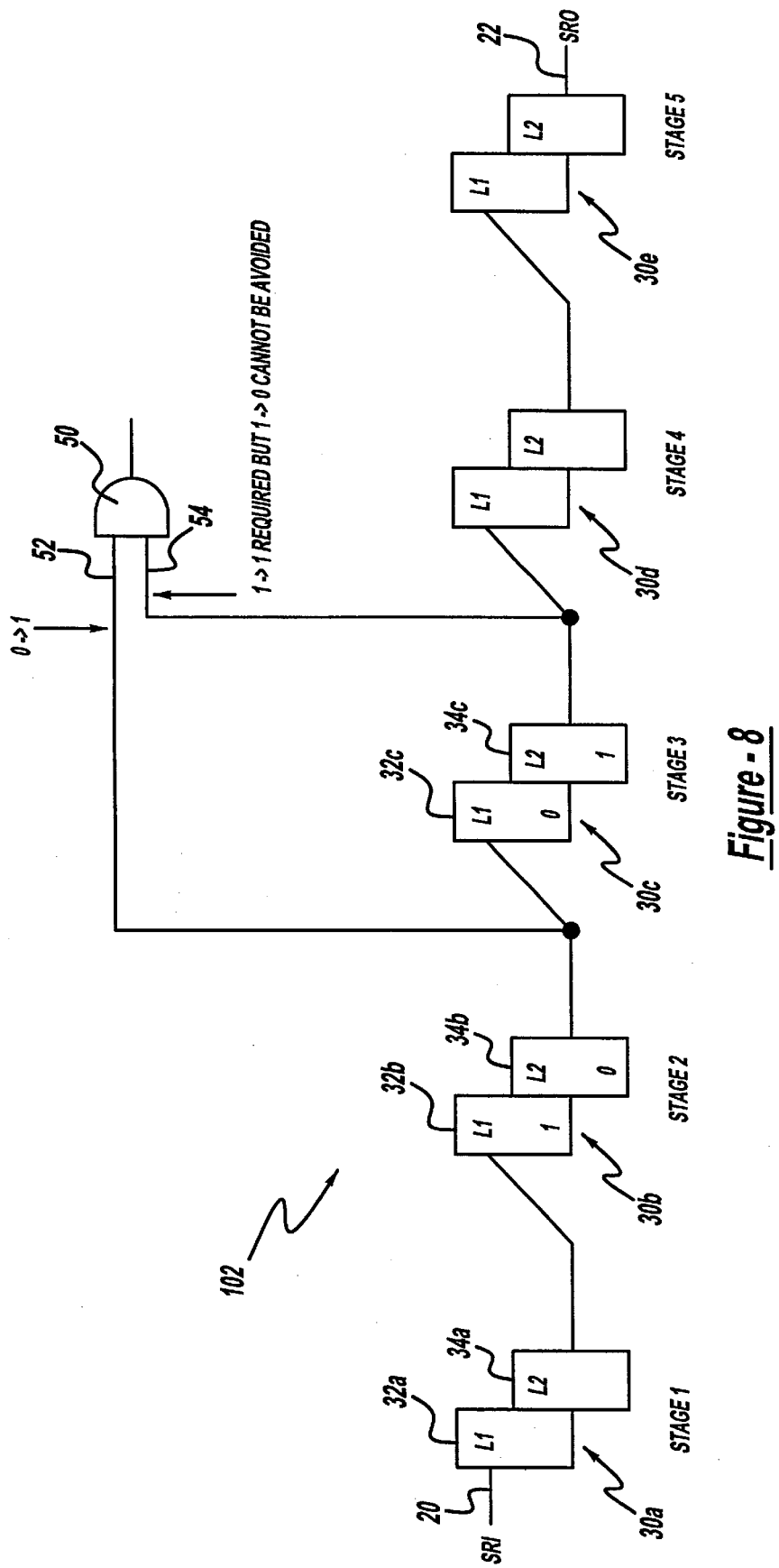
FIG. 8 is a schematic diagram demonstrating another latch adjacency problem associated with the scan chain circuit of FIG. 2.

FIG. 8 also shows an exemplary and simplified scan chain circuit 102 for demonstrating the latch adjacency problem similar to that of FIG. 3. The scan chain latch circuit 102 also includes a plurality of shift register latches 30a–30e, where each shift register latch 30 includes a master latch 32 and a slave latch 34. The scan chain 102 includes a serial input 20 to SRL 30a and a serial output 22 from SRL 30e. FIG. 3 also shows an AND circuit or gate 50 having a first input 52 connected to the output of SRL 30b, and a second input 54 connected to the output of SRL 30c. A known problem with scan chain 102 is the inability to test certain logic state transitions at the inputs of the AND gate 50 when adjacent latches 30b, 30c feed both inputs 52, 54 of the AND circuit 50. For example, in order to test the slow-to-rise fault (0 to 1) on input 52 of AND gate 50, the input 54 requires a 1 to 1 logic transition. As shown by the logic 1 and 0 states of latches 32b and 34b respectively, and the 0 and 1 logic states of the latches 32c and 34c, the necessary 0 to 1 transition can be provided to first input 54. However, the necessary 1 to 1 logic transition cannot be provided to the second input 56 because slave latch 34b and master latch 32c are directly connected and have the same logic 0 value. Thus, because of the structure of scan chain 96 (adjacent latches feeding the same basic logic gate) the required test patterns can never be achieved.

FIGS. 9A–9C show a modified scan chain latch circuit 110 in accordance with an alternate preferred embodiment of the present invention. The scan chain latch circuit 110 also comprises a plurality of shift register latches 30a–30c. Each SRL 30 includes a master latch 32 and a slave latch 34. As shown, a 2:1 multiplexor (MUX) 112 is connected between each SRL 30. Referring to FIG. 9B, each MUX 112 includes a b-input 114, a c-input 116 and an a-output 118. The c-input 116 is an inverting input. In operation, the logic signal present on either the b-input 114 or the c-input 116 can be output to the a-output 118. The switching between input lines 114, 116 is controlled by a select line 120. When one input is selected, the other input is assumed to be in a high impedance state. Multiplexor 112 is also a known electrical component, and a schematic diagram of its internal circuitry is shown in FIG. 9C.

Referring back to FIG. 9A, the b-input 114 of MUX 112a is connected to the output of the upstream adjacent slave latch 34a. The b-input 114 is also cross connected to the inverting c-input 116. The a-output 118 of MUX 112a feeds into the input of the downstream adjacent master latch 32b. All of the MUXs 112 are connected in this fashion. While it is preferred that all MUXs 112 are driven by a common select signal 120, this is not a requirement. As one skilled in the art will appreciate, this configuration also creates transition modifying circuit for forcing different transition states between adjacent shift register latches 30. If a transition test requirement has a latch adjacency problem when the select line 120 is at logic 0, then setting select line 120 to logic 1 in most cases can resolve the transition conflict. With the inverting MUX configuration of circuit 110, fault testability is significantly increased as will be shown in FIG. 12B.

Figure 10:
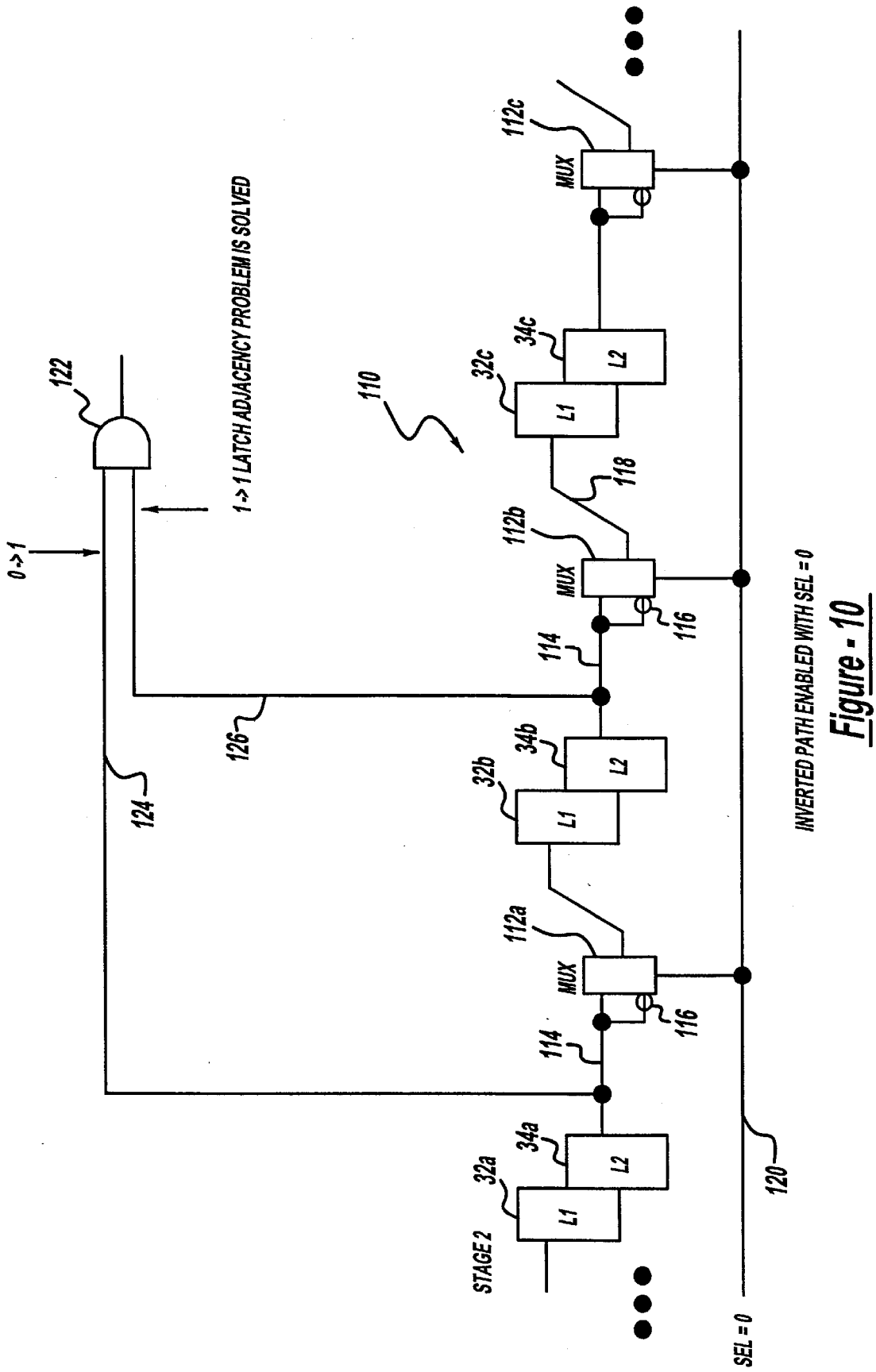
FIG. 10 is a schematic diagram demonstrating how the circuit of FIG. 9A solves the latch adjacency problem shown in FIG. 8.

FIG. 10 shows the scan chain circuit 110 of FIG. 9A and further demonstrates an alternate technique for solving the latch adjacency problem of FIG. 8. The scan chain circuit 110 also includes an AND gate 122 having a first input 124 connected to the output of slave latch 34a and a second input 126 connected to the output of slave latch 34b. It should be assumed that the inverted input c 116 is selected when the select line 120 is at logic 0. As shown by the logic 1 and 0 states of latches 32a and 34a respectively, and the 1 and 1 logic states of the latches 32b and 34b, a 0 to 1 transition can be provided to first input 124, and a 1 to 1 transition can be provided to a second input 126. This is because the 0 logic state of slave latch 34a is inverted to a logic state 1 by MUX 112a before reaching the input of master latch 32b. Thus, one skilled in the art will appreciate that scan chain circuit 110 of FIG. 9A can also be used as a solution to the latch adjacency problem of FIGS. 3 and 8.

Figure 11:
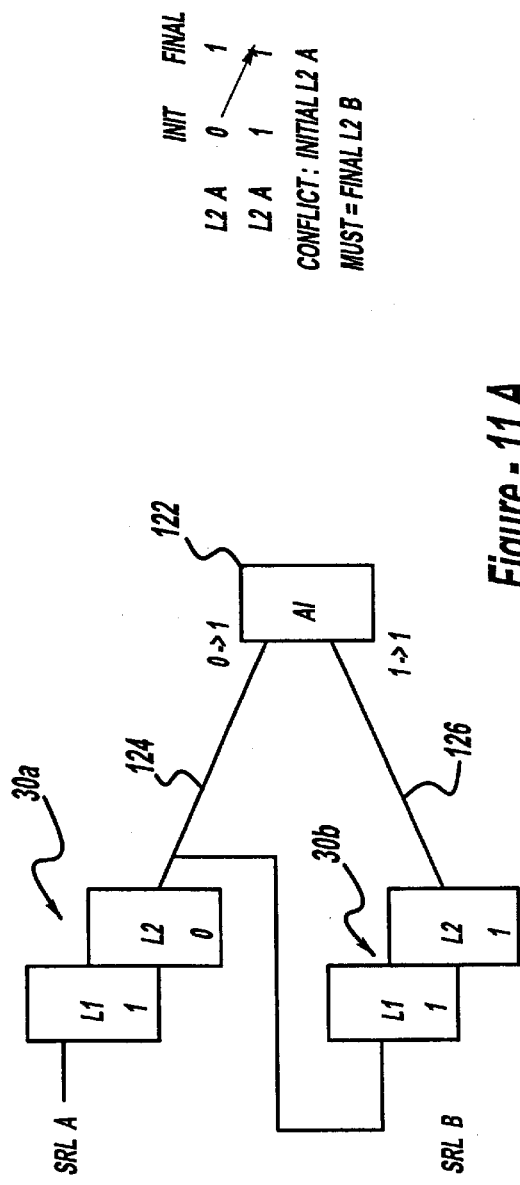
FIGS. 11A and 11B are circuit configurations and state diagrams for a two input NAND gate.
Figure 11:
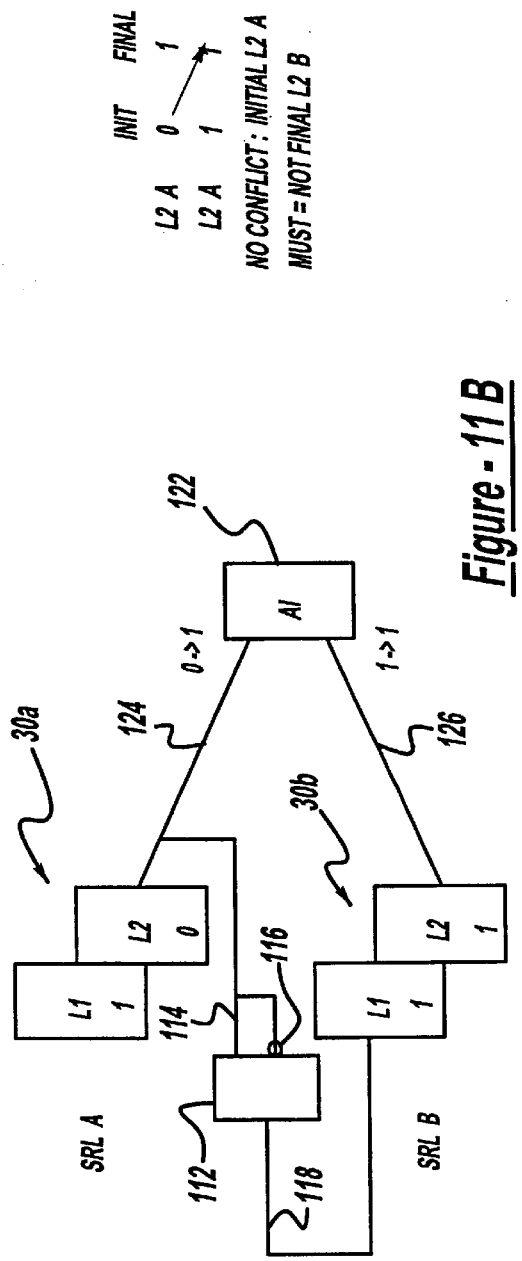
Figures 12A, 12B:
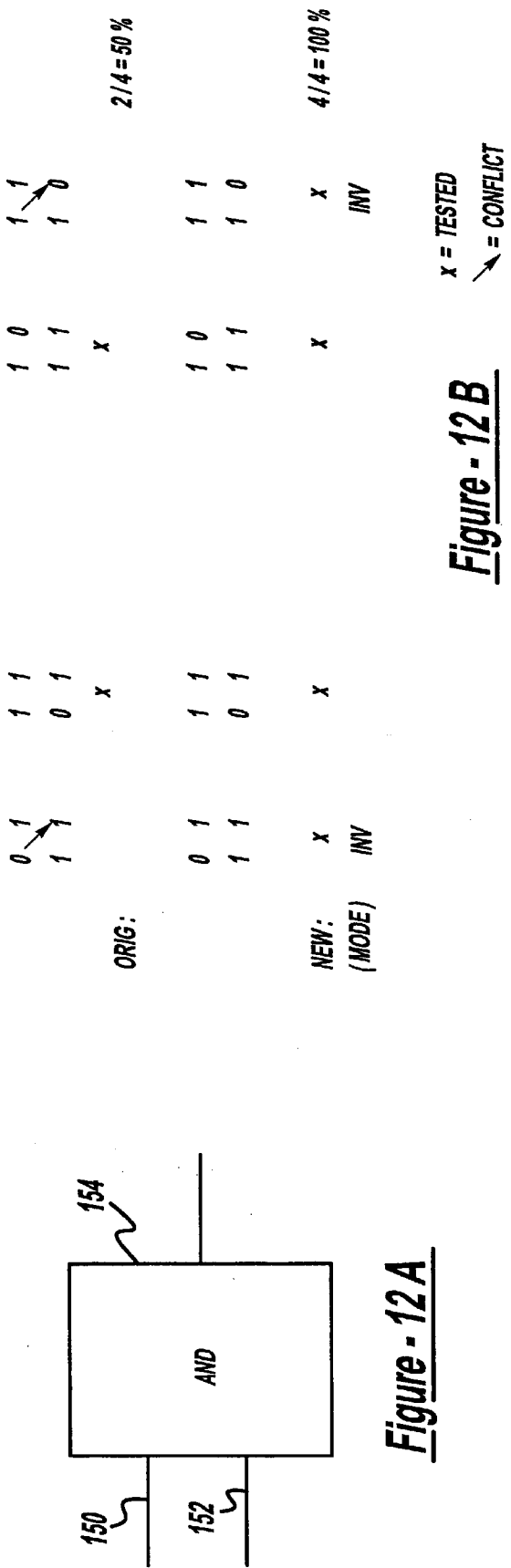
FIG. 12A is a schematic diagram for a two input NAND gate.
FIG. 12B is another state diagram for a two input NAND gate.

FIGS. 11A and 11B demonstrate a state diagram construction for a two input AND-INVERT (2W AI) or two input NAND gate 122 having a first input 124 connected to the output of SRL 30, and a second input 126 connected to the output of SRL 30b. A MUX 112 as described above is connected between SRL 30a and SRL 30b. FIG. 11A demonstrates the latch adjacency problem for NAND gate 122, and FIG. 11B demonstrates using MUX 112 as a solution for generating the necessary 0 to 1 logic transition on input 124 and generating a 1 to 1 logic transition on input 126. The state diagrams in table form of FIG. 12B represent transition tests that are applied to inputs of the 2-way AND circuit of FIG. 12A. This AND circuit is used as an example to demonstrate how this invention can relieve latch adjacency problems thus enhancing testing for transition faults. To test a 0–1 transition on the A input 150 of AND 154, input B 152 must be set to a logic 1 in its initial and final state. Likewise to test a 0–1 transition on the B input 152 of AND 154, input A 150 must be a logic 1 for its initial and final state. The two tests for the 1–0 transition are also shown. The results show that only two of four states of the circuit of FIG. 11A are testable (50%), while all four states of the circuit of FIG. 11B are testable (100%).

Figure 13:
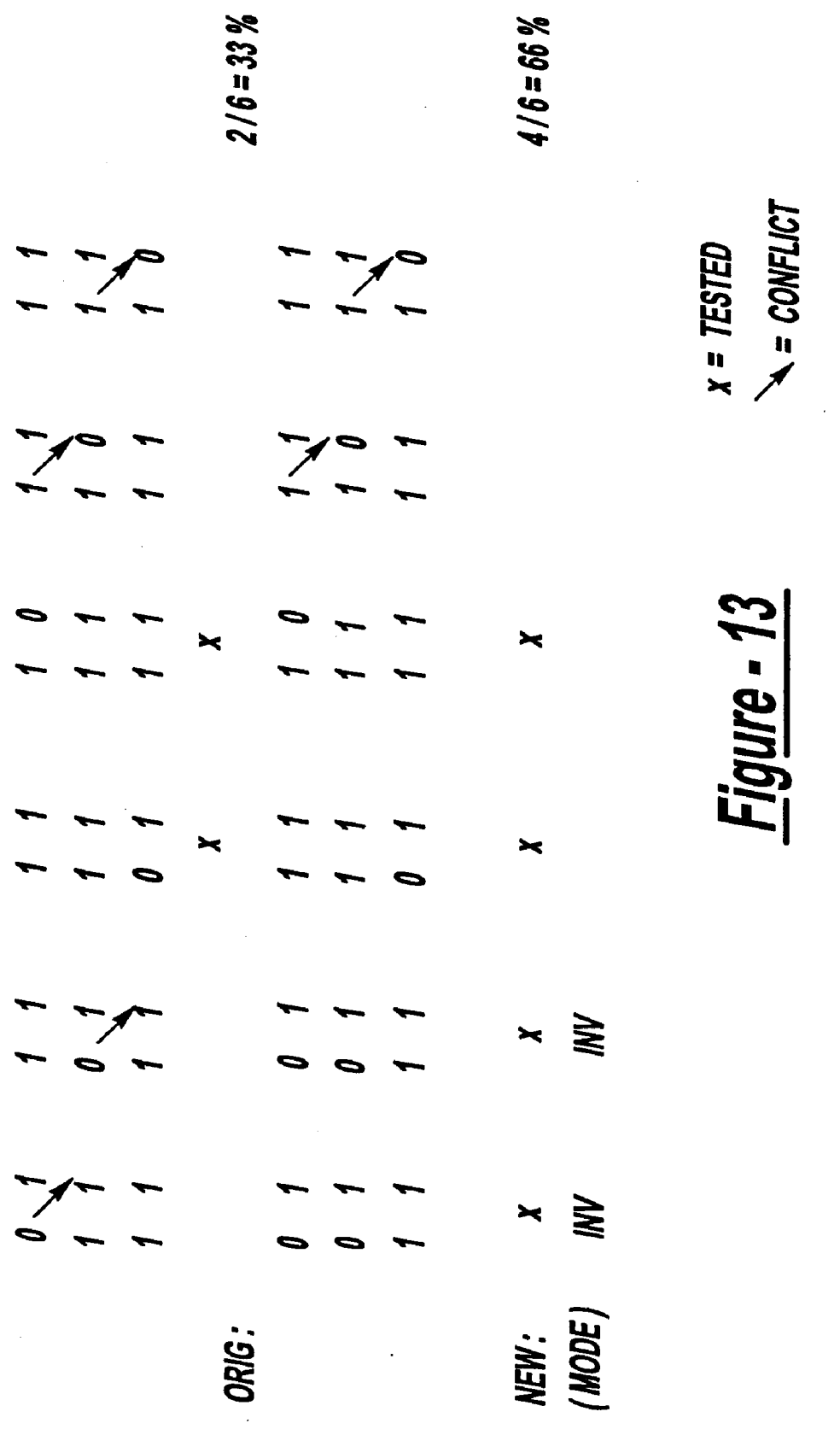
Figure 14:
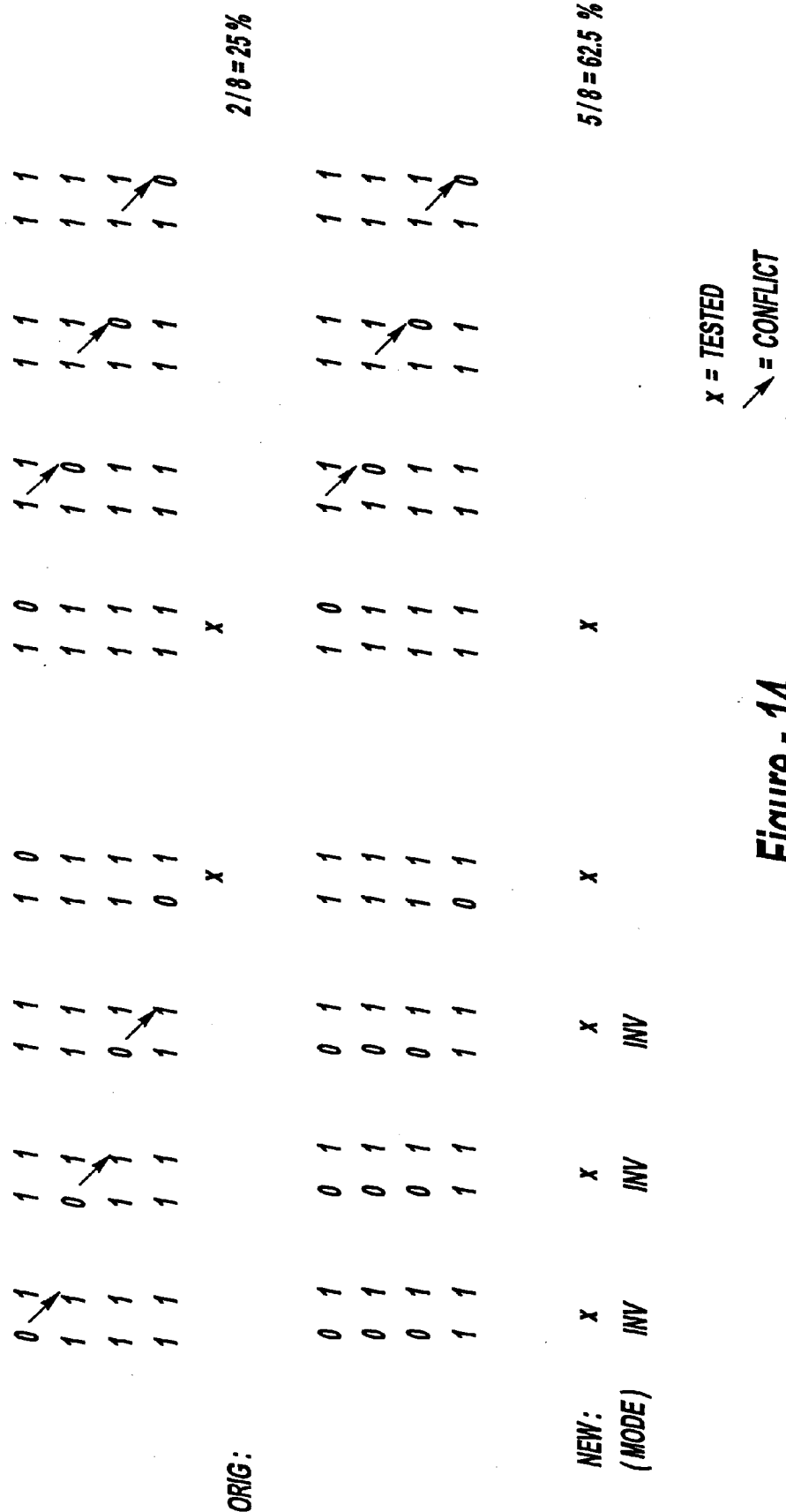
FIG. 14 is a state diagram for a four input NAND gate.

The NAND gate 122 can also have multiple inputs, including three inputs and four inputs. FIG. 13 is also a state diagram in table for showing that only two of six states of the circuit of FIG. 11A (connected to a three input NAND gate) are testable (33%), while four of six state of the circuit of FIG. 11B are testable (66%). Finally, FIG. 14 is also a state diagram in table for showing that only two of eight states of the circuit of FIG. 11A (connected to a four input NAND gate) are testable (25%), while five of eight state of the circuit of FIG. 11B are testable (62.5%). Thus, the circuit configuration 110 of FIG. 9A and the inverting MUX 112 can also be used for transition fault testing two, three, and four input NAND gates, in addition to transition fault testing AND gates, thereby solving the latch adjacency problem described above.

The results for AND, OR and NOR circuits are the same as the NAND circuits having the same number of inputs.

Test patterns to detect delay faults are generally generated in two ways: 1. By built-in self-test in a pseudo-random fashion (BIST); 2. By algorithmic means to target detection of certain fault types (stored patterns). These methods are often used together to increase test coverage. In this example, assume BIST is used followed by stored patterns. The scan inversion control signal SEL 120 may be made either pseudo-random controllable by the BIST engine, or independently controllable for instance by a chip input. To aid in diagnosis of scan fails, however, it is usually best to drive the SEL signal 120 through an external input. The definition of one BIST pattern is: 1. skewed load scan-in; 2. pulse B-clk 46 (launch); 3. pulse C1-clk 48 (capture); scan out. An exemplary use of this structure in a BIST environment is as follows:

1: set SEL=logic 0;
2: run BIST "n" patterns, calculate delay fault test coverage;
3: set SEL=logic 1;
4: run BIST "m" patterns, get additional delay fault test coverage.

When one is satisfied with the BIST test coverage (or the coverage is not increasing significantly with BIST pattern count), then stored patterns may be used to target the remaining untested faults. For maximum test efficiency, the algorithm used to generate the stored test patterns should be modified to account for the SEL signal 120 modifying the scan chain. One way of doing this is as follows:

1: set SEL=logic 0;
2: run stored pattern algorithm "n" patterns, calculate delay fault test coverage;
3: mark all delay faults untested due to scan conflict—call this fault subset $D_{us}$
4: set SEL=logic 1, indicating that scan chain is now inverted;
5: run stored pattern algorithm "m" patterns on $D_{us}$ fault subset, get additional delay fault test coverage;
6: run a known multi-time frame algorithm to get additional delay fault coverage.

Figures 15A, 15B:
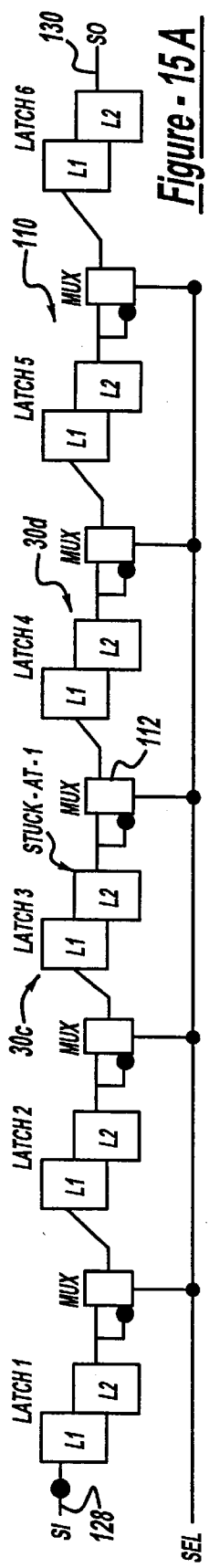
FIG. 15A is a schematic diagram of the scan chain circuit of FIG. 9A demonstrating a stuck value fault at the output of the third latch in the scan chain.
FIG. 15B is a logic table showing the steps for diagnosing a faulty scan chain utilizing the inverting feature of the multiplexors.

FIG. 15A also shows the scan chain circuit 110 of FIG. 9A and also includes the 2:1 inverting MUX 112 connected between each SRL 30. For exemplary purposes, FIG. 15A shows that the output of SRL 30c has a stuck-at 1 fault which is feeding into the b-input 114 of multiplexor 112c.

FIG. 15B shows a table used for diagnosing the fault associated with scan chain circuit 110 of FIG. 15A. For the exemplary test, it is assumed that a series of logic 0 values are scanned into input 128. When the select line 120 is in its first or logic 0 state, the latches 30a–30f operate serially during consecutive clock cycles, and the b-input 114 of each MUX 112 is passed to the a-output 118. Thus, if scan chain circuit is operating properly, the same series of logic 0 values should appear on output 130. As shown, seven clock cycles (0–6) are required to fully detect the fault at box 132 associated with the stuck-at 1 fault of SRL 30c. However, when select line 120 is placed into its second or logic 1 state, the multiplexors 112 create an inverting mode, and the inverted c-input 116 is passed to the a-output 118 (as described above with regard to FIG. 9A). As shown, the inverting feature allows the detected fault to be diagnosed at box 134 in four additional clock cycles. This is because the logic 1 at SRL 30c (latch 3) is inverted from 1 to 0 when a 0 to 1 is expected, and this value is scanned to the output 130 (latch 6) in four clock cycles. Accordingly, once a fault is detected at box 132, the location of the fault can be specifically located and diagnosed at box 134 by placing the multiplexors 112 into the inverting mode via select line 120. Detected stuck-at faults with other SRLs 30 can be diagnosed in a similar by analyzing the table of FIG. 15B.

With the scan chain circuit 110, single stuck-at scan faults can be quickly diagnosed. To do this, the scan chain 110 is fully loaded in a state opposite the stuck value with SEL=0. The inversion control signal SEL 120 is then set to logic 0 enabling the inverted scan mode. The chain is then scanned-out. Because the inverted scan mode is set, an alternate 101010 . . . pattern is expected on the scan out pin 130. When that pattern is broken, i.e., same logic value appears consecutively, the fault is detected. The location of the stuck fault is determined by the number of scan clocks that were applied when the consecutive values appeared.

Figure 16:
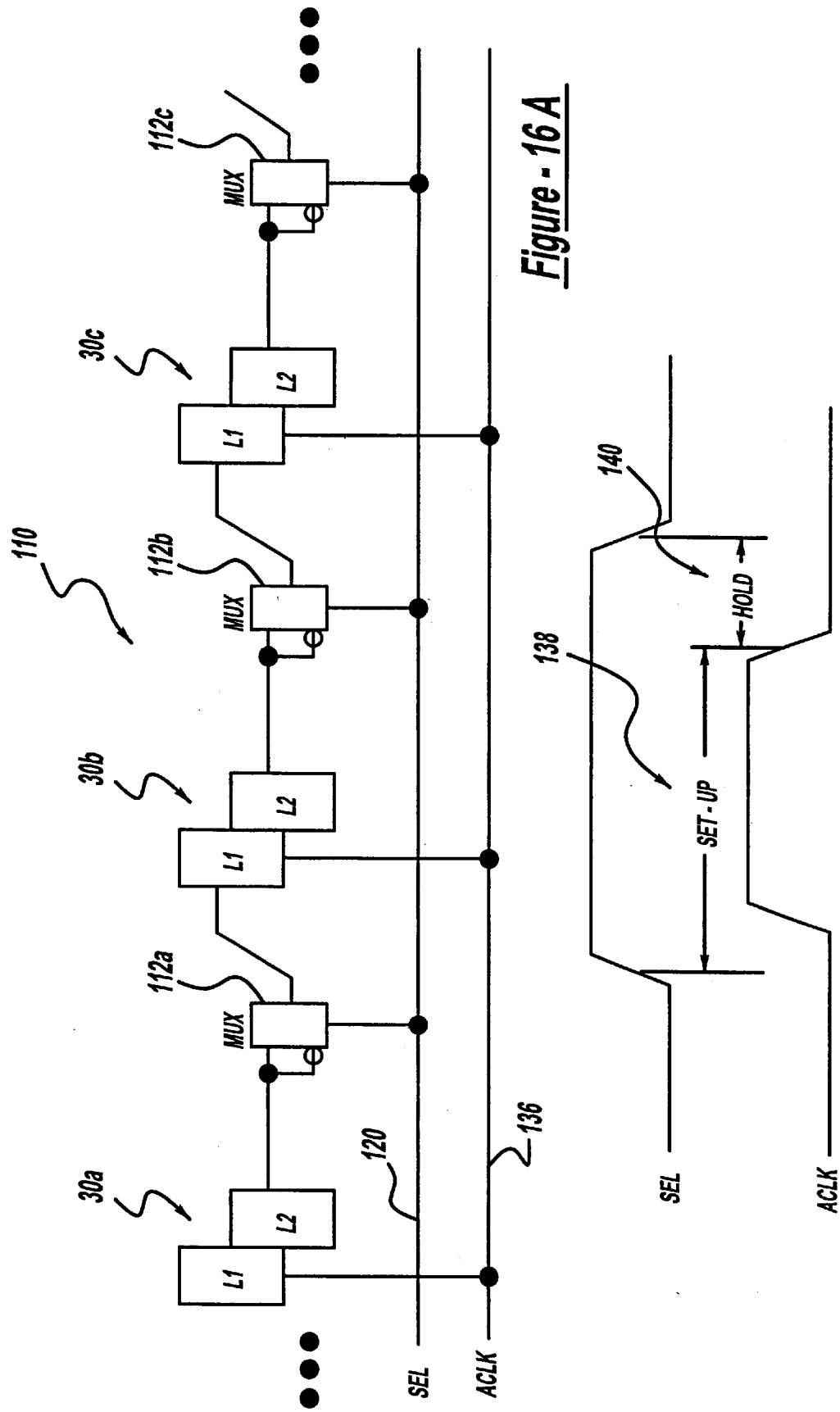
FIG. 16A is an alternate circuit configuration according the teachings of the present invention.
FIG. 16B is a timing diagram for the circuit of FIG. 16A.

FIG. 16A shows an alternate configuration for the scan chain circuit 110 using the inverting MUX 112. Also shown in FIG. 16A is that each SRL 30 includes an A-clk line 136. The timing diagram for the select line 120 and the A-clk line 136 are shown in FIG. 16B. The timing diagram shows a set-up period 138 where the select line 120 rises before the A-clk line 136. The timing diagram also show a hold period 140 where the A-clk line 136 falls before the select line 120 falls.

The SEL signal 120 does not have to remain in a constant state during the scan-in operation, and in general it will switch during the scan-in to give the most flexible test pattern generation capability. There is a timing constraint between the SEL signal 120 and the A-clock 136 shown in FIG. 16B. There must be a sufficient set-up time 138 and hold time 140 to guarantee data propagates from the L2 34 through the MUX 112 and is captured cleanly in the following L1 32 scan port. This is not a difficult constraint, however, since scan clocks are generally slower than system clocks.

The present method of accomplishing the same goal—simultaneously generating and propagating a transition—has been done by placing "dummy" SRLs or "scan-only" latches in between every pair of SRLs in the scan chain. This method uses more area on the semi-conductor die because the dummy latches are larger than the MUX. In addition, both A and B clocks must be routed to every dummy SRL, increasing the instances of routing conflicts. Because the number of loads increase on the A and B clocks repowering on those clocks generally needs to be increased. Finally, the number of latches is effectively doubled which either directly doubles the test time or forces reconfiguration of the scan chain.

The foregoing discussion discloses and describes exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A scan chain latch circuit comprising:
   a first shift register latch;
   a second shift register latch;
   a third shift register latch;
   a first multiplexor connected between the first shift register latch and the second shift register latch; and
   a second multiplexor connected between the second shift register latch and the third shift register latch;
   each multiplexor being configured for implementing an inverting mode such that a logic value may be passed via the first multiplexor from the first shift register latch to the second shift register latch in one of a non-inverted state and an inverted state based upon the state of a multiplexor select line.

2. The circuit of claim 1 wherein the first and second multiplexors are 2:1 multiplexors.

3. The circuit of claim 2 wherein the first and second multiplexors have a non-inverting input, an inverting input, and a single output.

4. The circuit of claim 3 wherein the first and second multiplexors can switch one of the non-inverting input and the inverting input to the single output via the select line.

5. The circuit of claim 2 wherein the first multiplexor includes a first input connected to an output of the first shift register latch, a second inverting input connected to the output of the first shift register latch, and a single output connected to an input of the second shift register latch.

6. The circuit of claim 5 wherein the second multiplexor includes a first input connected to an output of the second shift register latch, a second inverting input connected to the output of the second shift register latch, and a single output connected to an input of the third shift register latch.

7. The circuit of claim 1 wherein each shift register latch includes a master latch serially connected to a slave latch.

8. A method for testing a latch circuit comprising the steps of:
   providing a scan chain latch circuit having a first shift register latch and a second shift register latch;
   providing a multiplexor connected between the first shift register latch and the second shift register latch, the multiplexor having a select line for selecting a logic value from a plurality of multiplexor inputs and placing the logic value on a multiplexor output;
   preloading the scan chain latch circuit with a predeterminded test pattern of logic values;
   applying a clock signal to the scan chain latch circuit and shifting the test pattern through the scan chain latch circuit; and
   changing the state of the select line for altering the logic values in the test pattern.

9. The method of claim 8 wherein the multiplexor includes a first input and a second inverting input.

10. The method of claim 9 wherein the step of changing the state of the select line includes selecting a logic value from one of the first input and the second inverting input and placing the logic value on the multiplexor output.

11. The method of claim 8 wherein the multiplexor includes a first input connected to an output of the first shift register latch, a second inverting input connected to the output of the first shift register latch, and a single output connected to an input of the second shift register latch.

* * * * *